(12) United States Patent
Zimmer (10) Patent No.: US 11,487,422 B2
(45) Date of Patent: Nov. 1, 2022

(54) FORCE SENSING DOME SWITCH

(71) Applicant: Trent Zimmer, Broussard, LA (US)

(72) Inventor: Trent Zimmer, Broussard, LA (US)

(*) Notice: Subject to any disclaimer, the term of this patent is extended or adjusted under 35 U.S.C. 154(b) by 0 days.

(21) Appl. No.: 17/508,982

(22) Filed: Oct. 23, 2021

(65) Prior Publication Data

US 2022/0137764 A1    May 5, 2022

Related U.S. Application Data

(60) Provisional application No. 63/109,079, filed on Nov. 3, 2020.

(51) Int. Cl.
  *G06F 3/0488* (2022.01)
  *H05K 1/18* (2006.01)

(52) U.S. Cl.
  CPC .......... *G06F 3/0488* (2013.01); *H05K 1/181* (2013.01); *H05K 2201/10053* (2013.01)

(58) Field of Classification Search
  CPC .................................................. G06F 3/0488
  USPC ........................................................ 361/748
  See application file for complete search history.

(56) References Cited

U.S. PATENT DOCUMENTS

| | | | |
|---|---|---|---|
| 3,996,429 A | 12/1976 | Chu et al. | |
| 4,987,275 A | 1/1991 | Miller et al. | |
| 5,824,978 A | 10/1998 | Karasik et al. | |
| 6,423,918 B1 | 7/2002 | King et al. | |
| 6,936,777 B1 | 8/2005 | Kawakubo | |
| 7,652,216 B2 * | 1/2010 | Sharrah | H01H 13/64 200/1 B |
| 10,460,890 B2 * | 10/2019 | Zimmer | H01H 13/52 |
| 10,921,913 B1 * | 2/2021 | Fong | G06F 3/0442 |
| 2020/0311509 A1 * | 10/2020 | Benkley, III | G06F 21/32 |

* cited by examiner

*Primary Examiner* — Stanley Tso
(74) *Attorney, Agent, or Firm* — Asgaard Patent Services, LLC; F. Wayne Thompson, Jr.

(57) ABSTRACT

The force sensing dome switch is configured to simultaneously, or nearly simultaneously, close or open two separate circuits. For one of these circuits, the force sensing dome switch acts as a variable resistor whose value is controlled by applied force. Each force sensing dome switch is disposed upon a printed circuit board (PCB) comprising two separate circuits. An example force sensing dome switch comprises: a conductive dome in conductive contact with a first trace of a first circuit, the conductive dome is configured to make conductive contact with a second trace of the first circuit when pressed down; and a force-sensing resistor element positioned between the PCB and the conductive dome, the force-sensing resistor element overlays a pair of interdigitated traces of a second circuit and is configured to conductively connect the pair of interdigitated traces when pressed against the PCB by the conductive dome. The force-sensing resistor element is a layer of material whose resistance changes when force is applied.

16 Claims, 10 Drawing Sheets

FIG. 1

SECTION B-B
FIG. 2B

SECTION B-B

FORCE SENSING DOME SWITCH

CROSS-REFERENCE TO RELATED APPLICATION(S)

This application claims the benefit of U.S. Provisional Application Ser. No. 63/109,079, filed on Nov. 3, 2020, the entirety of which is incorporated herein by reference.

TECHNICAL FIELD

This disclosure relates to implementations of a force sensing dome switch. In particular, the present invention is directed to implementations of a dome switch that includes an integrated force sensing resistor.

BACKGROUND

Dome switches, or domes, used in conjunction with a printed circuit board (PCB), flex circuit, or membrane are well known to those of ordinary skill in the art. Domes are secured to a mounting substrate (e.g., a PCB) by an adhesive tape or captured in a pocket design. When pressed down, the domes collapse and make contact with two traces, thereby closing the circuit.

Force sensing resistors (FSR) are resistive sensors exhibiting varying resistance in response to force applied to the sensing area. As force on the FSR increases, resistance decreases. The sensing area of a FSR is also referred to as the FSR element, a material whose resistance changes when a force or pressure is applied. FSRs are used in conjunction with actuators. The actuator being the device used to touch, or actuate, the FSR. The relationship between input force and output resistance of a FSR is determined by sensor shape, trace geometry, and ink formulation used in the manufacturing process.

Accordingly, it can be seen that needs exist for the force sensing dome switch disclosed herein. It is to the provision of a force sensing dome switch configured to address these needs, and others, that the present invention is primarily directed.

SUMMARY OF THE INVENTION

Implementations of a force sensing dome switch are provided. The force sensing dome switch is configured to simultaneously, or nearly simultaneously, close or open two separate circuits. In this way, the force sensing dome switch acts as a double-pole, double-throw switch (DPDT). Further, for one circuit, the force sensing dome switch acts as a variable resistor whose value is controlled by applied force.

Each force sensing dome switch is disposed upon a printed circuit board (PCB) comprising a first circuit and a second circuit.

An example force sensing dome switch comprises: a conductive dome in conductive contact with a first trace of the first circuit, the conductive dome is configured to make conductive contact with a second trace of the first circuit when pressed down; and, a force-sensing resistor element positioned between the printed circuit board and the conductive dome, the force-sensing resistor element overlays a pair of interdigitated traces of the second circuit and is configured to conductively connect the pair of interdigitated traces when pressed against the printed circuit board by the conductive dome. The force-sensing resistor element is a layer of material whose resistance changes when force is applied.

Another example force sensing dome switch comprises: a conductive dome in conductive contact with portions of a first trace of the first circuit, the conductive dome is configured to make conductive contact with a second trace of the first circuit when pressed down; and, a force-sensing resistor element positioned between the printed circuit board and the conductive dome, the force-sensing resistor element overlays a pair of interdigitated traces of the second circuit and is configured to conductively connect the pair of interdigitated traces when pressed against the printed circuit board by the conductive dome. The force-sensing resistor element is a layer of material exhibiting varying resistance in response to applied force.

Yet another example force sensing dome switch comprises: a conductive dome comprising a first end and a second end, the first end and the second end of the conductive dome are in conductive contact with a first portion and a second portion, respectively, of a first trace of the first circuit, the conductive dome is configured so that pressing down on the conductive dome causes a portion thereof to make conductive contact with a second trace of the first circuit; and, a force-sensing resistor element positioned between the printed circuit board and the conductive dome, the force-sensing resistor element overlays a pair of interdigitated traces of the second circuit and is configured to conductively connect the pair of interdigitated traces when pressed against the printed circuit board by the conductive dome. The force-sensing resistor element is a layer of material exhibiting varying resistance in response to applied force.

BRIEF DESCRIPTION OF THE DRAWINGS

Like reference numerals refer to corresponding parts throughout the several views of the drawings.

DETAILED DESCRIPTION

Figure 1:
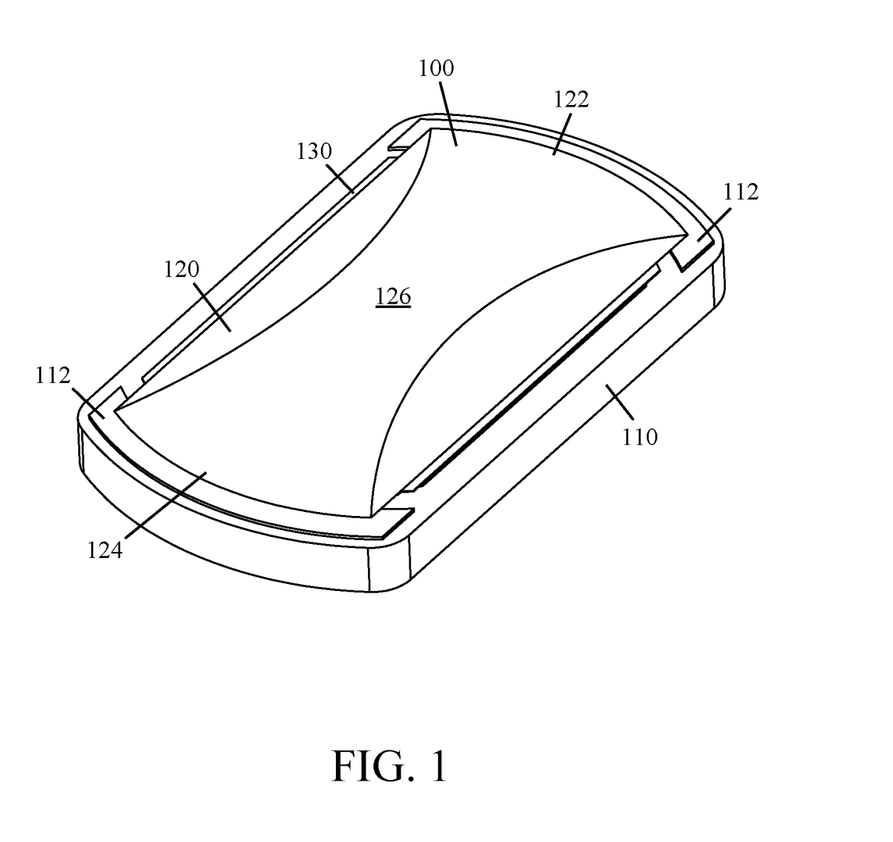
FIG. 1 illustrates an example force sensing dome switch according to the principles of the present disclosure.
Figure 2A:
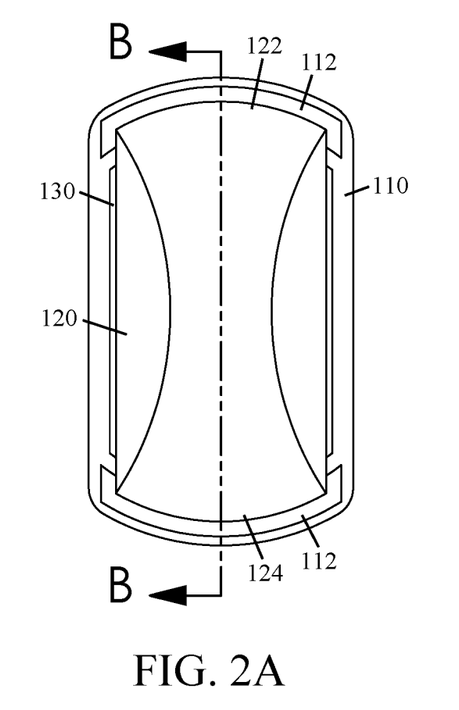
FIG. 2A illustrates a top plan view of the force sensing dome switch shown in FIG. 1.
Figure 2B:
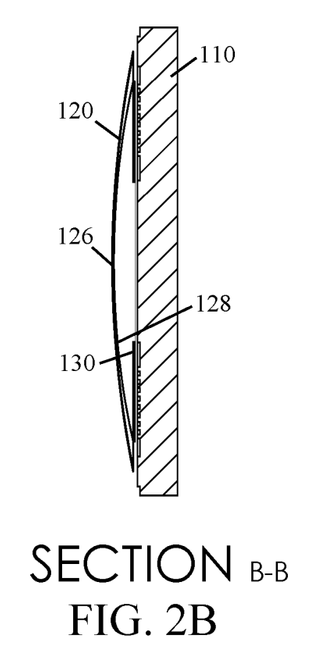
FIG. 2B illustrates a side cutaway view of the force sensing dome switch taken along lines B-B shown in FIG. 2A.
Figure 3:
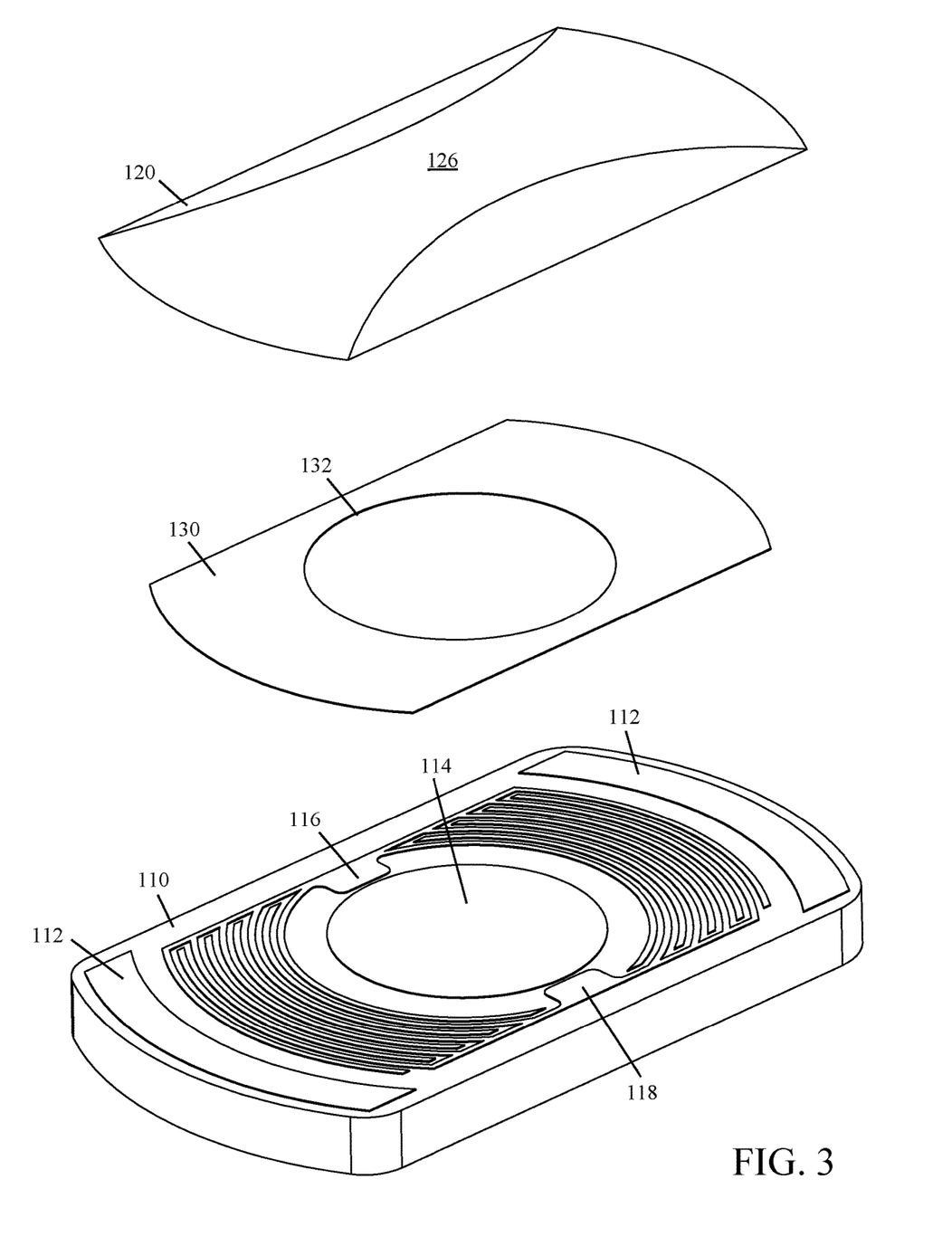
FIG. 3 illustrates an exploded view of the force sensing dome switch shown in FIG. 1.

FIGS. 1-3 illustrate an example force sensing dome switch 100 according to the principles of the present disclosure. The force sensing dome switch 100 is configured to simultaneously, or nearly simultaneously, close or open two separate circuits. In this way, the force sensing dome switch 100 acts as a double-pole, double-throw switch (DPDT). Further, for one circuit, the force sensing dome switch 100 acts as a variable resistor whose value is controlled by applied force.

As shown, in some implementations, an example force sensing dome switch 100 is disposed upon a printed circuit board (PCB) 110 and comprises a conductive dome 120 and a force-sensing resistor (FSR) element 130.

Figure 4:
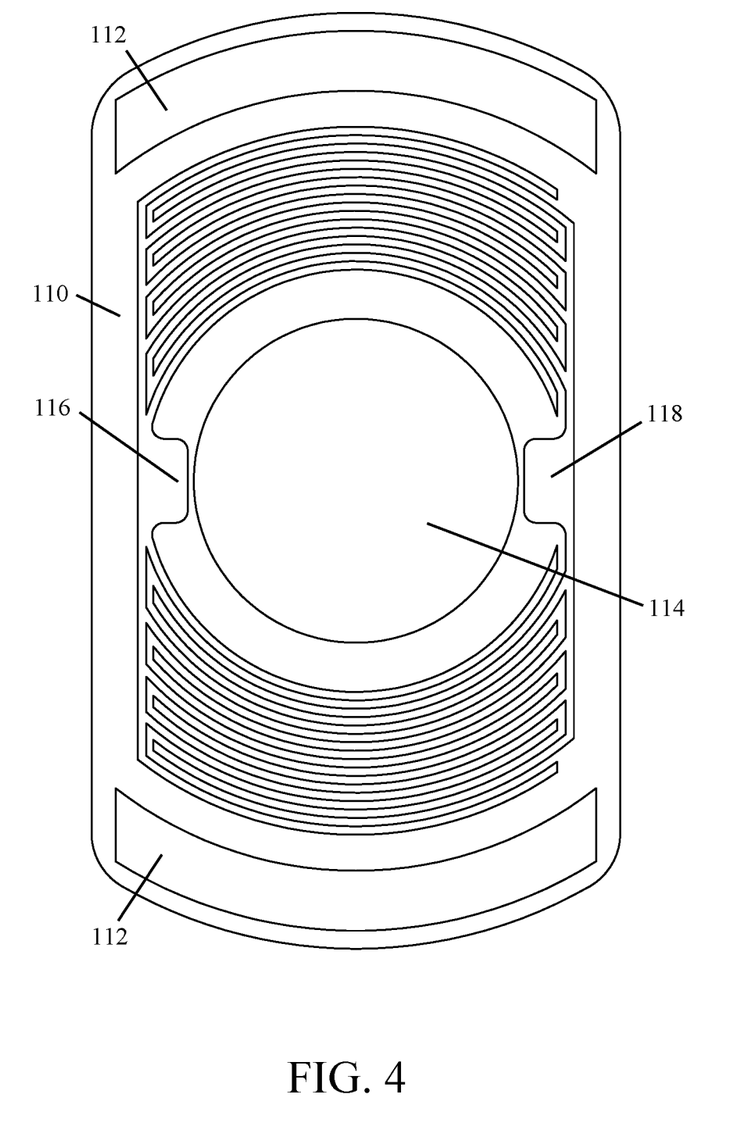
FIG. 4 illustrates a top plan view of the printed circuit board (PCB) shown in FIG. 3.

As shown best in FIG. 4, the example PCB 110 includes a first set of traces 112, 114 that are portions of a first open circuit and a second set of interdigitated traces 116, 118 that are portions of a second open circuit. It should be noted that the interdigitated traces 116, 118 are electrically isolated.

A shown, the conductive dome 120 is fabricated from an electrically conductive, resilient material (e.g., a stainless steel or a resilient material plated with a suitably conductive metal). The conductive dome 120 is positioned on the PCB so that each end 122, 124 is in conductive contact with portions of the first trace 112. In this way, each end 122, 124 acts as an electrical contact. The conductive dome 120 is configured to collapse when pressed down with sufficient force (e.g., 230 g) and, in some implementations, provide a crisp tactile response. When collapsed, a central portion 126 of the conductive dome 120 makes contact with the second trace 114 on the PCB 110. In this way, until released, the conductive dome 120 conductively connects the first set of traces 112, 114 and thereby closes the first circuit. While an oblong dome 120 is shown, it should be understood that other domes (e.g., circular, triangle, or other custom shapes) may be used without departing from the scope of the present invention.

As shown, the FSR element 130 is positioned between the PCB 110 and the conductive dome 120 so that it overlays the set of interdigitated traces 116, 118. As shown best in FIG. 3, the FSR element 130 is a layer of material (e.g., a Mylar film or other suitable metallized biaxially-oriented polyethylene terephthalate film) having a hole 132 therein and a force sensing resistor (FSR) ink printed on one side. The hole 132 in the FSR element 130 is configured (dimensioned and positioned) so no portion of the FSR element 130 overlays the circular trace 114 on the PCB 110. In this way, the central portion 126 of the conductive dome 120, when pressed down, can extend through the hole 132 in the FSR element 130 to make contact with the second trace 114. The FSR element 130 is positioned so the side with the FSR ink is facing down, towards the interdigitated traces 116, 118. As an example, the FSR element 130 may be a portion of XactFSR pre-printed sensor film sold by Sensitronics, LLC, or another suitable shunt mode FSR element. One of ordinary skill in the art would be able to select an appropriate FSR element 130 based on the intended use of the force sensing dome switch 100.

The FSR element 130 is configured (positioned and shaped) to conductively connect the interdigitated traces 116, 118 on the PCB 110 when pressed against the PCB 110 by the conductive dome 120. As such, the FSR element 130 and the interdigitates traces 116, 118 on the PCB 110 form a force sensing resistor, a type of variable resistor well known to those of ordinary skill in the art. A force sensing resistor is a resistive sensor exhibiting varying resistance that responds to force applied to the sensing area (i.e., the FSR element 130). As force on the FSR element 130 is increased, the resistance of the FSR element 130 decreases.

When pressed down with sufficient force, the conductive dome 120 collapses causing a central portion 126 thereof to make contact with the second trace 114 on the underlying PCB 110. In this way, until released, the conductive dome 120 conductively connects the first set of traces 112, 114 and thereby closes the first circuit. Simultaneously, or nearly simultaneously, the bottom side 128 of the collapsible dome 120 presses the FSR element 130 against the indigitated traces 116, 118 on the PCB 110. In this way, until released, the conductive dome 120 also causes the FSR element 130 to conductively connect the interdigitated traces 112, 114, thereby closing the second circuit and sending a signal to a connected electronic device. Pressing harder on the conductive dome 120 reduces the resistance of the FSR element 130 and changes the signal being sent to the connected electronic device.

In some implementations, an insulating tape (e.g., a pressure-sensitive adhesive tape) may be used to cover the force sensing dome switch 100. In this way, the conductive dome 120 and the FSR element 130 are held in position on the PCB 110. The insulating tape could be an electrical insulating polyester tape.

Figure 5:
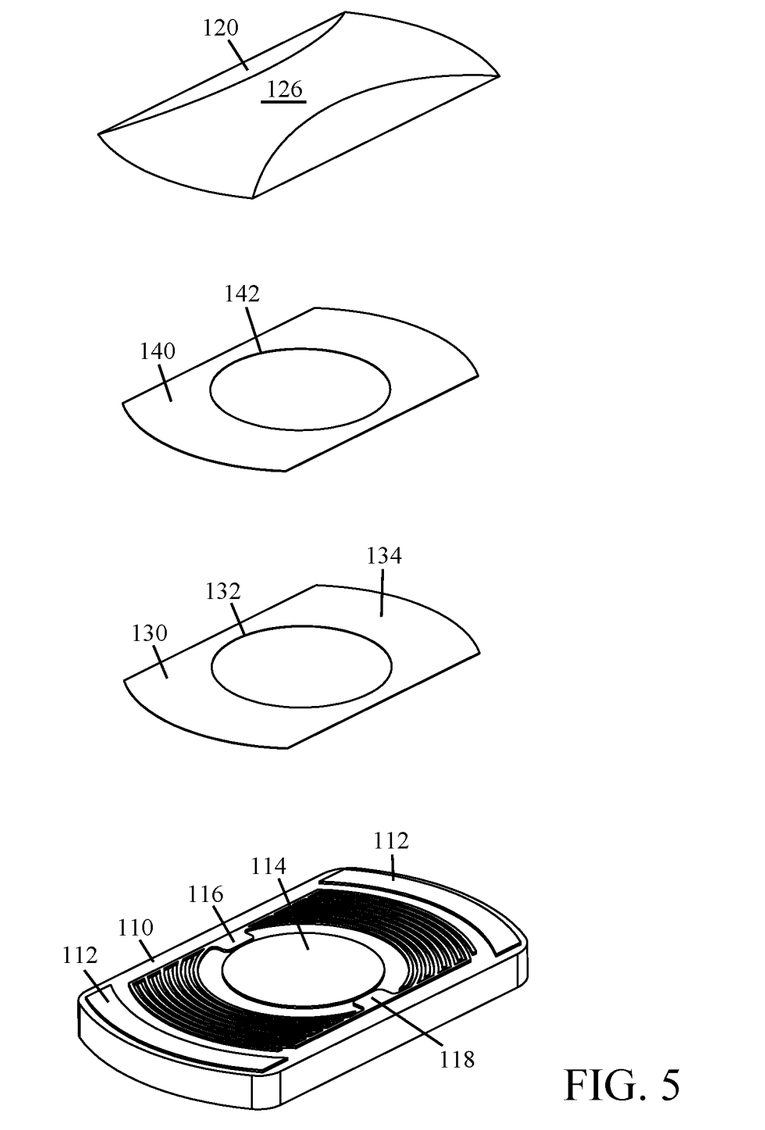
FIG. 5 illustrates an exploded view of another example force sensing dome switch according to the principles of the present disclosure, wherein a spacer is shown positioned between the conductive dome and the FSR element.

As shown in FIG. 5, in some implementations, a spacer 140 having a hole 142 can be positioned between the conductive dome 120 and the FSR element 130. The hole 142 in the spacer 140 is positioned to be in axial alignment with the hole 132 in the FSR element 130, and configured (dimensioned and positioned) so no portion of the spacer 140 overlays the circular trace 114 on the PCB 110. The thickness of the spacer 140 will play a part in determining the amount of force required for the FSR element 130 and the interdigitated traces 116, 118 to come into contact. An example spacer 140 could be fabricated from a nonconductive double-sided tape. If the spacer 140 is fabricated from a double-sided tape, adhesive secures the spacer 140 to the bottom side 128 of the conductive dome 120 and the top side 134 of the FSR element 130.

Figure 6:
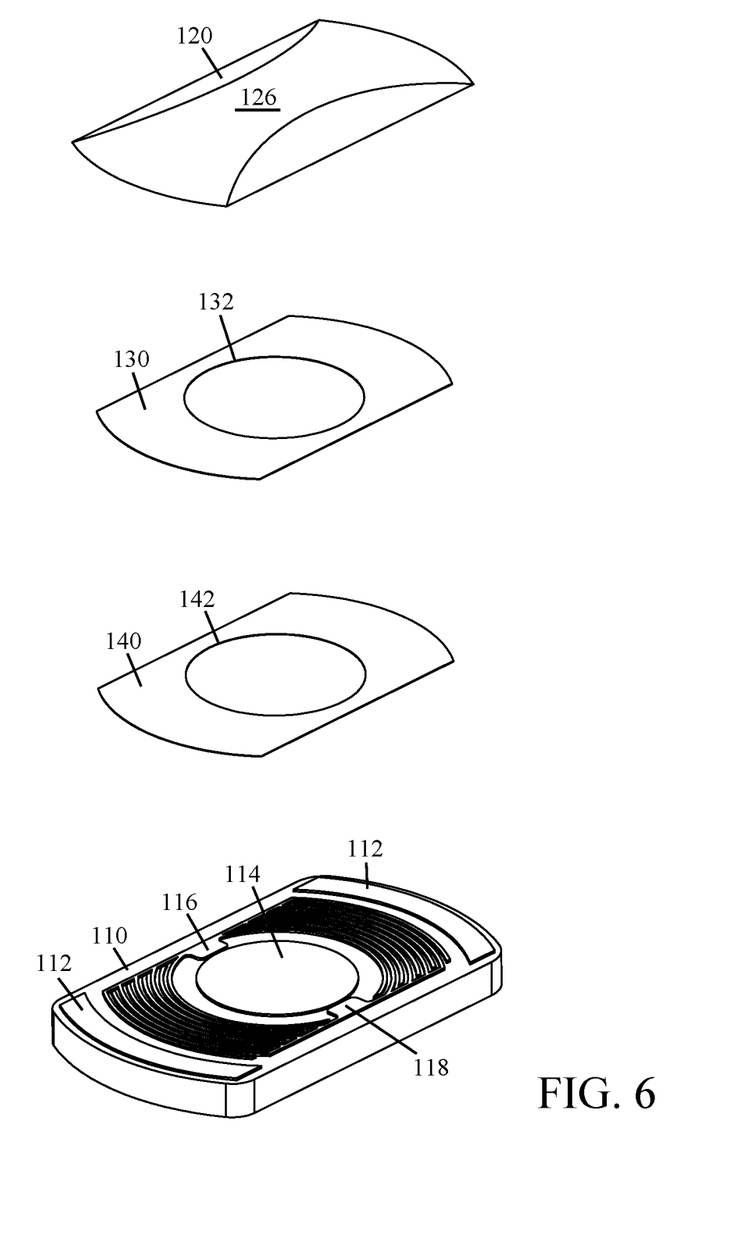
FIG. 6 illustrates an exploded view of yet another example force sensing dome switch according to the principles of the present disclosure, wherein the spacer is shown positioned between the PCB and the FSR element.
Figure 7:
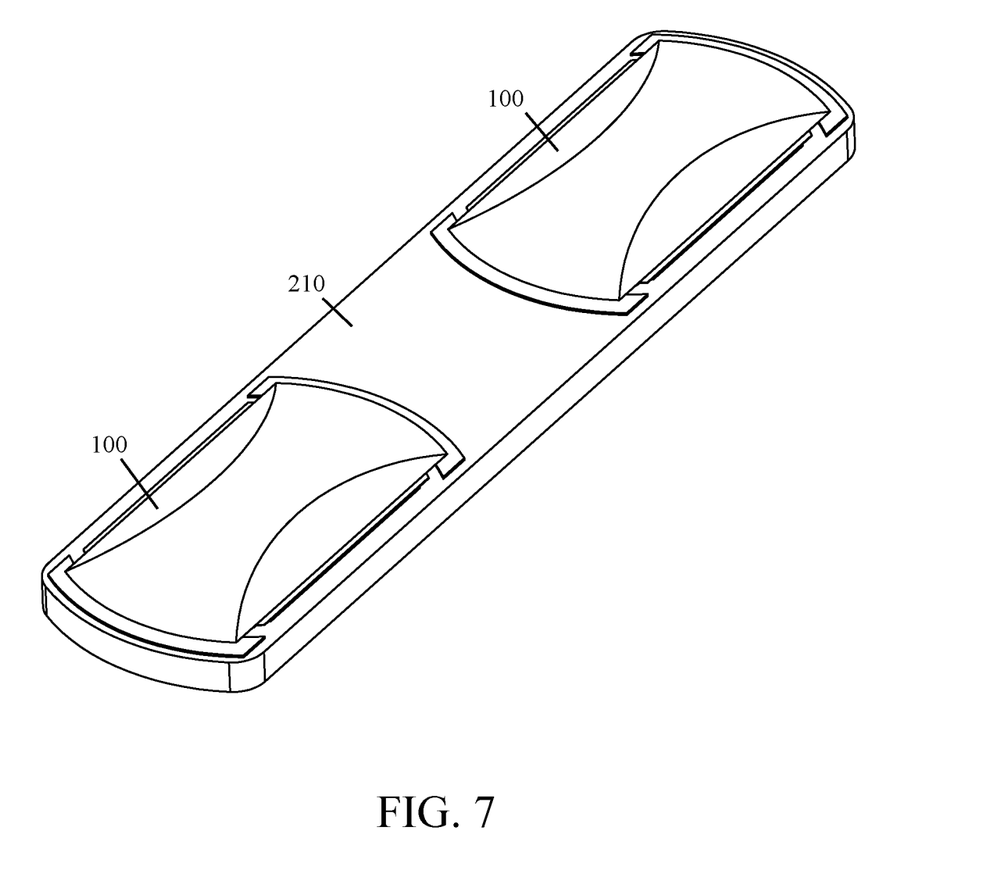
FIG. 7 illustrates two force sensing dome switches disposed on another example PCB.
Figure 8A:
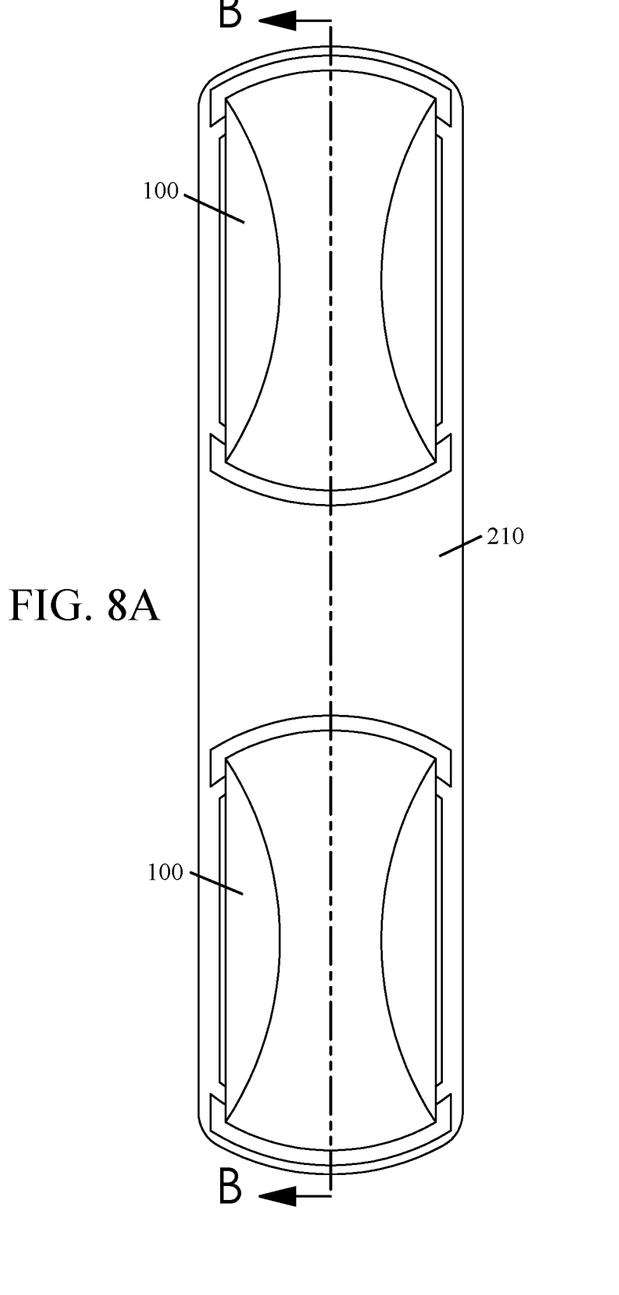
FIG. 8A illustrates a top plan view of the force sensing dome switches shown in FIG. 7.
Figure 8B:
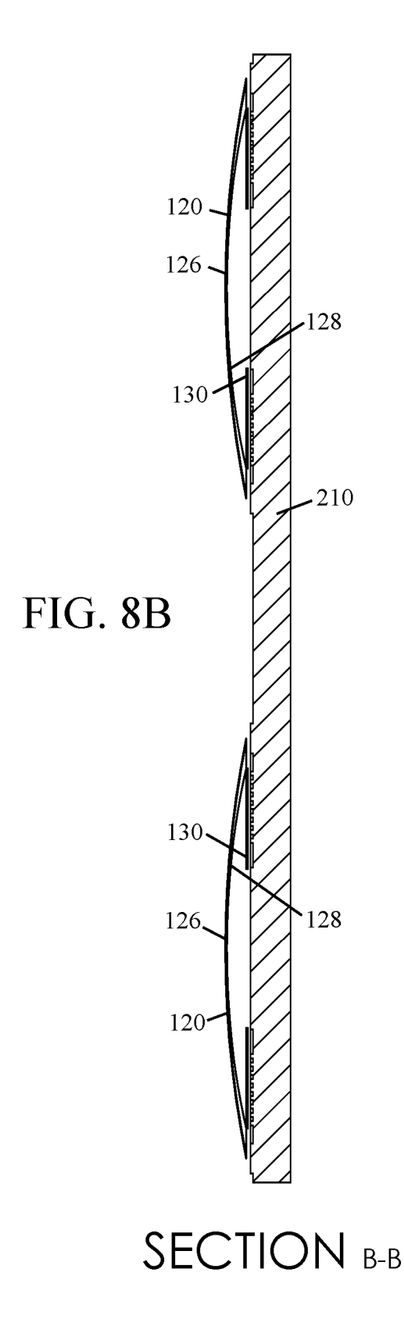
FIG. 8B illustrates a side cutaway view of the force sensing dome switches taken along lines B-B shown in FIG. 8A.
Figure 9:
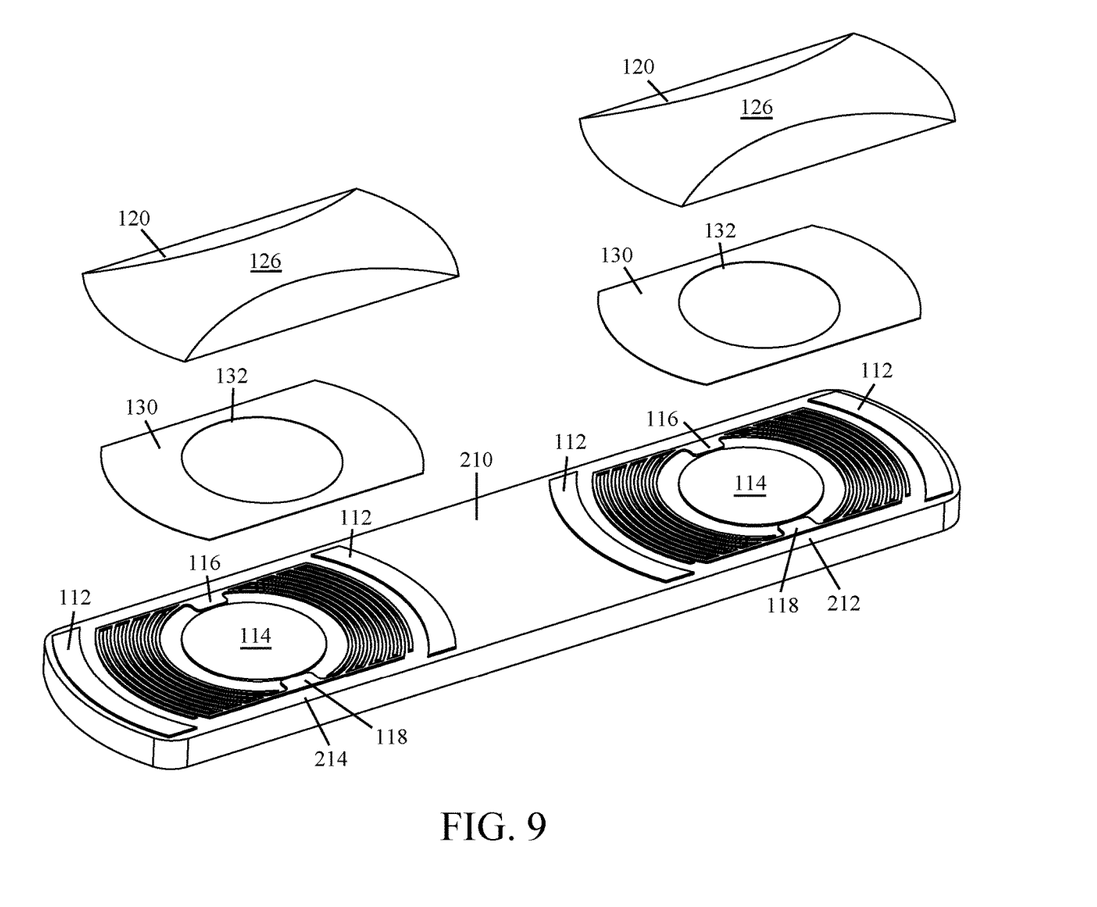
FIG. 9 illustrates an exploded view of the force sensing dome switches shown in FIG. 7.

As shown in FIG. 6, in some implementations, a spacer 140 having a hole 142 can be positioned between the PCB 110 and the FSR element 130. The hole 142 in the spacer 140 is positioned to be in axial alignment with the hole 132 in the FSR element 130, and configured (dimensioned and positioned) so no portion of the spacer 140 overlays the circular trace 114 on the PCB 110. The thickness of the spacer 140 will play a part in determining the amount of force required for the FSR element 130 and the interdigitated traces 116, 118 to come into conductive contact. Although not shown, in some implementations, the hole in the spacer could be configured (i.e., dimensioned) so that no portion of the spacer 140 overlays the interdigitated traces 116, 118 on the PCB 110. An example spacer 140 could be fabricated from 3M™ Adhesive Transfer Tape 467MP, or another electrically conductive double-sided tape. If the spacer 140 is fabricated from a double-sided-tape, adhesive secures the spacer 140 to the bottom side of the FSR element 130 and the top side of the PCB 110.

FIGS. 7-10 illustrate a PCB 210 that has two force sensing dome switches 100 disposed thereon. While the two force sensing dome switches 100 are positioned on the PCB 210 in tandem, it should be understood that a PCB could be configured so the force sensing dome switches 100 are positioned side by side.

Figure 10:
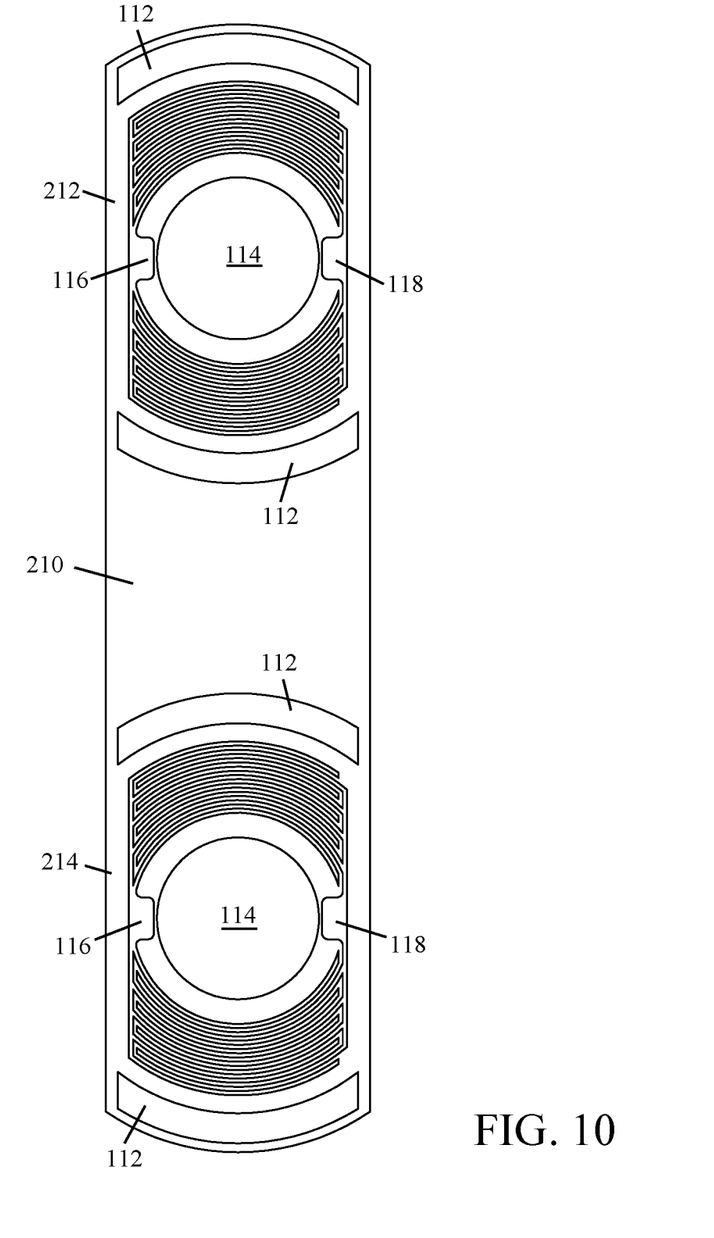
FIG. 10 illustrates a top plan view of the PCB shown in FIG. 9.

As shown best in FIG. 10, the example PCB 210 includes a mounting position 212, 214 for each force sensing dome switch 100. Each mounting position 212, 214 includes a first set of traces 112, 114 that are portions of a first open circuit and a second set of interdigitated traces 116, 118 that are portions of a second open circuit. It should be noted that the interdigitated traces 116, 118 are electrically isolated.

It is contemplated hereunder that a multi-pole dome switch, such as is described in U.S. Pat. No. 10,460,890; entitled "MULTI-POLE DOME SWITCH, could be adapted to include a FSR element 130 and the underlying interdigitated traces 116, 118 of the force sensing dome switch 100 described herein. Such implementations of the multi-pole dome switch would include the additional functionality provided by a force sensing resistor (FSR).

Reference throughout this specification to "an embodiment" or "implementation" or words of similar import means that a particular described feature, structure, or characteristic is included in at least one embodiment of the present invention. Thus, the phrase "in some implementations" or a phrase of similar import in various places throughout this specification does not necessarily refer to the same embodiment.

Many modifications and other embodiments of the inventions set forth herein will come to mind to one skilled in the art to which these inventions pertain having the benefit of the teachings presented in the foregoing descriptions and the associated drawings.

The described features, structures, or characteristics may be combined in any suitable manner in one or more embodiments. In the above description, numerous specific details are provided for a thorough understanding of embodiments of the invention. One skilled in the relevant art will recognize, however, that embodiments of the invention can be practiced without one or more of the specific details, or with other methods, components, materials, etc. In other instances, well-known structures, materials, or operations may not be shown or described in detail.

While operations are depicted in the drawings in a particular order, this should not be understood as requiring that such operations be performed in the particular order shown or in sequential order, or that all illustrated operations be performed, to achieve desirable results.

The invention claimed is:

1. A force sensing dome switch disposed upon a printed circuit board comprising a first circuit and a second circuit, the force sensing dome switch comprising:
    a conductive dome in conductive contact with a first trace of the first circuit, the conductive dome is configured to make conductive contact with a second trace of the first circuit when pressed down; and
    a force-sensing resistor element positioned between the printed circuit board and the conductive dome, the force-sensing resistor element overlays a pair of interdigitated traces of the second circuit and is configured to conductively connect the pair of interdigitated traces when pressed against the printed circuit board by the conductive dome;
    wherein the force-sensing resistor element is a layer of material whose resistance changes when force is applied.

2. The force sensing dome switch of claim 1, wherein the force-sensing resistor element has a hole therein, the hole is configured so no portion of the force-sensing resistor element overlays the second trace of the first circuit.

3. The force sensing dome switch of claim 2, further comprising a spacer positioned between the conductive dome and the force-sensing resistor element, the spacer has a hole therein configured so no portion of the spacer overlays the second trace of the first circuit.

4. The force sensing dome switch of claim 2, further comprising a spacer positioned between the force-sensing resistor element and the printed circuit board, the spacer has a hole therein configured so no portion of the spacer overlays the second trace of the first circuit.

5. The force sensing dome switch of claim 1, wherein the conductive dome is fabricated from an electrically conductive and resilient material.

6. A force sensing dome switch disposed upon a printed circuit board comprising a first circuit and a second circuit, the force sensing dome switch comprising:
    a conductive dome in conductive contact with portions of a first trace of the first circuit, the conductive dome is configured to make conductive contact with a second trace of the first circuit when pressed down; and
    a force-sensing resistor element positioned between the printed circuit board and the conductive dome, the force-sensing resistor element overlays a pair of interdigitated traces of the second circuit and is configured to conductively connect the pair of interdigitated traces when pressed against the printed circuit board by the conductive dome;
    wherein the force-sensing resistor element is a layer of material exhibiting varying resistance in response to applied force.

7. The force sensing dome switch of claim 6, wherein the force-sensing resistor element has a hole therein, the hole is configured so no portion of the force-sensing resistor element overlays the second trace of the first circuit.

8. The force sensing dome switch of claim 7, further comprising a spacer positioned between the conductive dome and the force-sensing resistor element, the spacer has a hole therein configured so no portion of the spacer overlays the second trace of the first circuit.

9. The force sensing dome switch of claim 7, further comprising a spacer positioned between the force-sensing resistor element and the printed circuit board, the spacer has a hole therein configured so no portion of the spacer overlays the second trace of the first circuit.

10. The force sensing dome switch of claim 6, wherein the conductive dome is fabricated from an electrically conductive and resilient material.

11. A force sensing dome switch disposed upon a printed circuit board comprising a first circuit and a second circuit, the force sensing dome switch comprising:
    a conductive dome comprising a first end and a second end, the first end and the second end of the conductive dome are in conductive contact with a first portion and a second portion, respectively, of a first trace of the first circuit, the conductive dome is configured so that pressing down on the conductive dome causes a portion thereof to make conductive contact with a second trace of the first circuit; and
    a force-sensing resistor element positioned between the printed circuit board and the conductive dome, the force-sensing resistor element overlays a pair of interdigitated traces of the second circuit and is configured to conductively connect the pair of interdigitated traces when pressed against the printed circuit board by the conductive dome;
    wherein the force-sensing resistor element is a layer of material exhibiting varying resistance in response to applied force.

12. The force sensing dome switch of claim 11, wherein the force-sensing resistor element has a hole therein, the hole is configured so no portion of the force-sensing resistor element overlays the second trace of the first circuit.

13. The force sensing dome switch of claim 12, further comprising a spacer positioned between the conductive dome and the force-sensing resistor element, the spacer has a hole therein configured so no portion of the spacer overlays the second trace of the first circuit.

14. The force sensing dome switch of claim 12, further comprising a spacer positioned between the force-sensing resistor element and the printed circuit board, the spacer has a hole therein configured so no portion of the spacer overlays the second trace of the first circuit.

15. The force sensing dome switch of claim 11, wherein the conductive dome is fabricated from an electrically conductive and resilient material.

16. The force sensing dome switch of claim 11, wherein the pair of interdigitated traces of the second circuit are positioned between the first portion and the second portion of the first trace of the first circuit, the pair of interdigitated traces of the second circuit are positioned around the second trace of the first circuit.

\* \* \* \* \*